United States Patent [19]
Murata et al.

[11] Patent Number: 5,371,755
[45] Date of Patent: Dec. 6, 1994

[54] OPTICAL TRANSMISSION MODULE

[75] Inventors: Atsushi Murata; Nobuhiro Matsudaira; Yuuki Sato, all of Yokohama, Japan

[73] Assignees: Hitachi, Ltd., Tokyo; Hitachi Communication System Inc., Yokohama, both of Japan

[21] Appl. No.: 26,816

[22] Filed: Mar. 5, 1993

[30] Foreign Application Priority Data

May 22, 1992 [JP] Japan .................. 4-131089

[51] Int. Cl.$^5$ .................. H01S 3/00
[52] U.S. Cl. .................. 372/38
[58] Field of Search .................. 372/38

[56] References Cited

U.S. PATENT DOCUMENTS

| | | | |
|---|---|---|---|
| 4,060,739 | 11/1977 | Russer et al. | 307/319 |
| 4,995,044 | 2/1991 | Blazo | 372/38 |
| 5,111,065 | 5/1992 | Roberge | 372/38 |
| 5,123,024 | 6/1992 | Dowd et al. | 372/38 |
| 5,224,111 | 6/1993 | Stilwell et al. | 372/38 |
| 5,241,552 | 8/1993 | Bergmann | 372/38 |

OTHER PUBLICATIONS

Collected Papers in the National Convention of the Institute of Electronics Information and Communication Engineers of Japan, 1989, Spring, pp. 4–100 In Japanese.

*Primary Examiner*—Rodney B. Bovernick
*Assistant Examiner*—Robert E. Wise
*Attorney, Agent, or Firm*—Antonelli, Terry, Stout & Kraus

[57] ABSTRACT

An optical transmitter can communicate at a transmission speed exceeding Gb/s with a low bit error rate. An optical transmission module includes a semiconductor module having a semiconductor laser and an impedance matching element, a driver circuit for driving the semiconductor laser to emit an optical signal, and an optical fiber for transmitting the optical signal. The impedance matching element matches an impedance of the semiconductor laser module to an impedance of the driver circuit. The optical transmission module includes an impedance element for reducing an input impedance of the semiconductor laser module as viewed from the driving circuit in order to reduce a fall time of the optical signal. Impedance matching elements and are added to remove possible mismatching between the module and the driver circuit caused by a manufacturing error and to improve the yield of the module.

13 Claims, 5 Drawing Sheets (EQUATION 1)

$$t_{f1} = \sqrt{(\log_e 9 CR)^2 + (\frac{1}{A \cdot f_r})^2 + t_{fic}^2 + (\frac{1}{f_c})^2}$$

OPTICAL TRANSMISSION MODULE

BACKGROUND OF THE INVENTION

The present invention relates to a semiconductor laser module, and more particularly to an optical transmission module suitable for optical transmission systems.

In the optical communication system in which emitted light of a semiconductor laser is dynamically intensity modulated to be transmitted through an optical fiber, a high receiving sensitivity is required in order to attain ultra high-speed operation in the band of a transmission speed of the order of Gb/s and extend a transmissible distance without repeater. An optical signal being transmitted through the optical fiber causes an inter-symbol interference due to deterioration of a signal waveform, which is a main cause for deterioration of the receiving sensitivity.

Heretofore, in order to reduce the deterioration of the receiving sensitivity, a semiconductor laser having an excellent narrow spectral line width of a single mode is used. Further, there has been proposed in the collected papers in the national convention of the Institute of Electronics, Information and Communication Engineers of Japan, 1989, spring, pp. 4-100 that an impedance matching circuit is connected between a semiconductor laser and a driver circuit for driving the semiconductor laser in series to the semiconductor laser to thereby suppress a parasitic reactance component between semiconductor laser and the driver circuit so that a jitter due to the impedance mismatching is reduced to improve the transmission quality.

FIG. 2 is a block diagram schematically illustrating a conventional optical transmitter including an impedance matching circuit. An impedance matching circuit 100 is connected between a semiconductor laser 8 and a semiconductor laser driver circuit 1 for driving the laser 8. Connected to the semiconductor laser driver circuit is an input terminal for inputting a signal. The optical transmitter further includes a thermistor 4 for measuring a temperature of the semiconductor laser 8, a thermoelectrical cooler 3 for cooling the semiconductor laser 8, and an automatic laser temperature control circuit 2 for controlling a temperature of the semiconductor laser 8 by using the thermistor 4 and the thermoelectrical cooler 3. The optical transmitter further includes a monitor photodiode 9 for detecting emitted light of the semiconductor laser 8 and an automatic optical power control circuit 6 for feedback controlling the intensity of the emitted light by using the detection result.

In FIG. 2, an input signal a supplied from the input signal terminal 5 is supplied to the semiconductor laser driver circuit 1 to be an optical modulation current $i_m$. The optical modulation current $i_m$ is superposed on a DC bias current $I_B$ to be supplied to the semiconductor laser 8 provided in a semiconductor laser diode module 7 through the impedance matching circuit 100 formed of a reflection preventing microstrip line and an impedance matching element 12. Thus, the semiconductor laser 8 emits light and its forward light output is guided to an optical fiber not shown while its backward light output is incident to the monitor photodiode 9. The impedance matching element 12 is connected to reduce a jitter in an emitted light signal and match impedances between the laser 8 and the driver circuit 1. The monitor photodiode 9 produces a current in response to the incident light and the current is converted into a voltage by means of a resistor 11 to be supplied to the automatic optical power control circuit 6. The circuit 6 controls the semiconductor laser driver circuit 1 in response to the voltage from the resistor 11 and sets the optical modulation current $i_m$ and the DC bias current $I_B$ to make constant an output current of the monitor photodiode 9. Thus, a power of the optical signal supplied to the optical fiber is made constant.

On the other hand, a temperature of the semiconductor laser 8 is detected by the thermistor 4 and the automatic laser temperature control circuit 2 controls the thermoelectrical cooler 3 in response to the detected output of the thermistor 4 to maintain constant the temperature of the semiconductor laser 8.

Further, in such a prior art, in order to drive the semiconductor laser by a high-frequency signal, it is necessary to reduce a parasitic inductance of the impedance matching circuit 100 and the impedance matching element 12. To this end, the impedance matching circuit comprises a so-called printed resistor formed on a board of ceramic by printing. In addition, as shown in FIG. 2, the semiconductor module 7 in which the semiconductor laser 8, the monitor photodiode 9 and the impedance matching element 12 (if necessary, further including the thermoelectrical cooler 3 and the thermistor 4) are hermetically sealed to be formed integrally is used in an optical transmitter.

The printed resistors used in the conventional optical transmitters as the impedance matching element 12 may have different resistance values for possible manufacturing errors ranging about plus or minus 10 percent even if they are manufactured in the same structure by the same manufacturing processes. Further, the semiconductor lasers used generally in the optical transmitters also may have different resistance values with deviations of about plus or minus 40% due to possible manufacturing errors in their cavity length or an amount of impurity to be doped. When the printed resistor and the semiconductor laser having such non-uniform resistance values and supplied as standard goods are directly used to manufacture the optical transmitters as they are, the impedances of the semiconductor laser and the impedance matching circuit result in their greatly differing and mismatching with each other.

Accordingly, although the printed resistor is provided as the impedance matching element 12, the impedance mismatching occurs actually between the semiconductor laser or the semiconductor laser module and the semiconductor driver circuit. Further, such a non-uniform impedance of the semiconductor laser for each product means that a waveform of the produced optical signal is non-uniform for each product.

When the semiconductor lasers and the printed resistors have different non-uniform impedances as described above, it is necessary to measure resistance values of the printed resistors and the semiconductor lasers one by one and select preferred printed resistors and the semiconductor lasers having the same resistance values as design values in order for the purpose of the impedance matching. Such a selection extremely reduces the yield of the printed resistors and the semiconductor lasers and increases a manufacturing cost of the optical transmitter.

In a conventional low transmission speed of about 100 Mb/s, the waveform of the signal has specifically no problem. Recently, however, it has been found that it is specifically important to use an optical transmitter capable of producing a signal having a fixed waveform in order to effect communication with a low bit error rate as an optical transmitter capable of operating at a very high transmission speed exceeding Gb/s is developed. However, the conventional optical transmitter including the impedance matching circuit is improved in reduction of the jitter in the optical signal but is not considered with respect to control of the signal waveform.

SUMMARY OF THE INVENTION

It is an object of the present invention to provide an optical transmitter capable of communicating with a low bit error rate at a transmission speed exceeding Gb/s.

It is another object of the present invention to provide an optical transmitter capable of being manufactured with a low cost while reducing a jitter.

It is a further object of the present invention to provide a low-cost optical transmitter using a semiconductor laser diode hermetically sealed in a semiconductor module in which driver means for the diode, impedance matching means for matching impedances between the driving means and the diode are hermetically sealed with the diode, and operating at a transmission speed of the order of Mb-Gb.

It is a still further object of the present invention to provide semiconductor laser modules which is convenient for a manufacturer of optical transmitters using semiconductor laser diodes.

In order to achieve the above objects, according to one aspect of the present invention, in an optical transmission module including a semiconductor module having a semiconductor laser and an impedance matching element, a driving circuit for driving the semiconductor laser to emit an optical signal and an optical fiber for transmitting the optical signal and in which the impedance matching element matches an impedance of the semiconductor laser module to an impedance of the driving circuit, in order to reduce a fall time of the optical signal, an impedance element is provided for reducing an input impedance of the semiconductor laser module as viewed from the driving circuit.

Further, according to another aspect of the present invention, there is provided an optical transmission module comprising a semiconductor laser, a driving circuit for driving the semiconductor laser to emit an optical light signal, an optical fiber for transmitting the emitted light signal, first impedance matching means for matching impedances between the semiconductor laser and the driving circuit, and second impedance matching means for correcting possible impedance mismatching occurring between the semiconductor laser and the driving circuit due to possible impedance error or deviation of at least any of the semiconductor laser and the first impedance matching means.

The impedance element may be a resistor R1 connected in parallel with the semiconductor laser module.

The first impedance matching means may include a resistor Ri connected between the semiconductor laser and the driving circuit in series to the semiconductor laser and the second impedance matching means may include at least any of a resistor R1 connected in parallel with the semiconductor laser and a resistor R2 connected in series to the semiconductor laser.

In the optical transmission module according to the first aspect of the present invention, the impedance element reduces a bit error rate by reducing a fall time of a signal waveform of emitted light of the semiconductor laser. FIG. 6 shows characteristics of the bit error rate for different fall times $t_{fl}$ of the optical waveform. It can be understood that a receiving sensitivity is good when the fall time $t_{fl}$ of the optical waveform is small. At this time, a rising time of the optical output waveform is sufficiently small because of an overshoot caused by relaxation oscillations of the semiconductor laser and the receiving sensitivity characteristic is greatly controlled by the fall time $t_{fl}$ of the optical waveform.

Reduction of the fall time can be achieved by reducing the input impedance of the semiconductor laser as viewed from the semiconductor laser driving circuit. As the impedance element, for example, by connecting the resistor R1 in parallel with the semiconductor laser, the input impedance of the semiconductor laser can be reduced.

Further, the optical transmission module according to the second aspect of the present invention comprises the second impedance matching means in addition to the first impedance matching means for matching impedances between the semiconductor laser and the driving circuit. The second impedance matching means is used to compensate and eliminate the impedance mismatching possible occurring between the driving circuit and the semiconductor laser due to an error of an impedance included in at least any of the semiconductor laser and the first impedance matching means. Thus, since non-uniform resistance values of the semiconductor laser and the first impedance matching means can be compensated, the yield of the semiconductor laser and the first impedance matching means can be increased. Accordingly, a low-cost optical transmission module can be obtained.

For example, the first impedance matching means may include a resistor Ri connected between the semiconductor laser and the driving circuit in series to the semiconductor laser and the second impedance matching means may include at least any of a resistor R1 connected in parallel with the semiconductor laser and a resistor R2 connected in series to the semiconductor laser.

DESCRIPTION OF THE PREFERRED EMBODIMENTS

Embodiment 1

Figure 1:
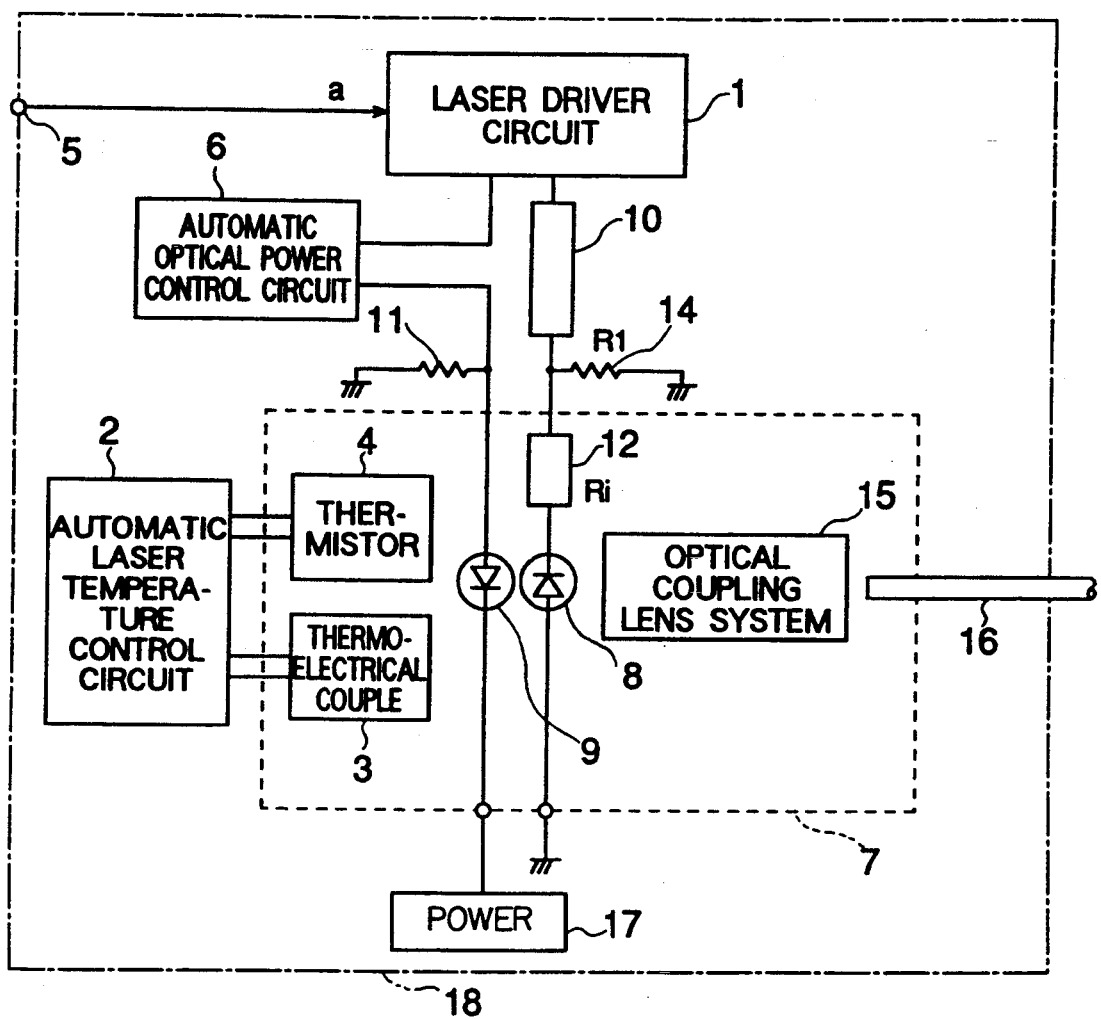
FIG. 1 is a block diagram schematically illustrating an optical transmission module according to a first embodiment of the present invention.
Figure 2:
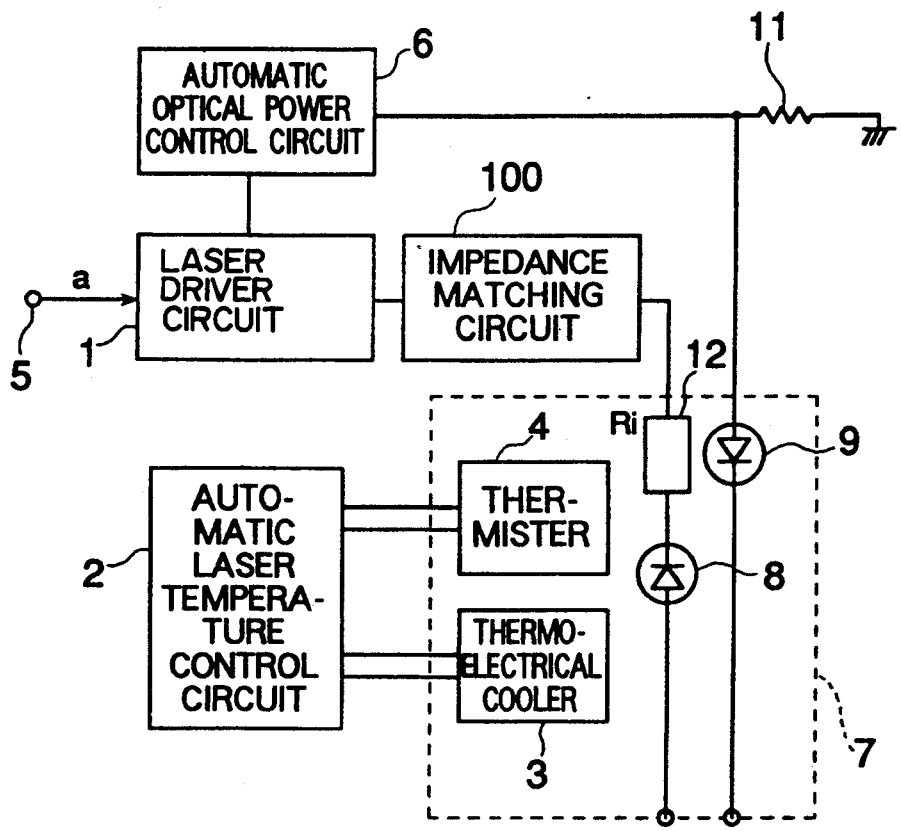
FIG. 2 is a block diagram schematically illustrating a conventional optical transmission module.

An optical transmission module 18 of the first embodiment of the present invention is an optical transmission module capable of effecting transmission at a high speed of 2.4 Gb/s. As shown in FIG. 1, the optical transmission module 18 of the embodiment includes a semiconductor laser 8 and a semiconductor laser driver circuit 1 for driving the semiconductor laser 8. An impedance matching element 12 is connected in series to the semiconductor laser 8 between the semiconductor laser 8 and the driver circuit 1 to match an impedance of the driver circuit 1 to an impedance of the semiconductor laser 8. Further, the semiconductor laser 8 is connected to the driver circuit through an impedance matching circuit 10 for preventing reflection. Connected in parallel to the impedance matching element 12 and the semiconductor laser 8 is a fall time adjusting resistor 14 for adjusting a fall time of an optical signal emitted by the semiconductor laser 8. In the embodiment the fall time adjusting resistor 14 has the function of correcting a possible impedance mismatching occurring between the driver circuit 1 and the semiconductor laser due to a possible impedance error or deviation caused in at least any of the semiconductor laser 8 and the impedance matching element 12.

An optical coupling lens system 15 for collecting emitted light of the semiconductor laser 8 and an optical fiber 16 for transmitting the collected light of the optical coupling lens system 15 are disposed at an emission end in front of the semiconductor laser 8. Further, a monitor photodiode 9 for detecting an intensity of the emitted light of the semiconductor laser 8 is disposed at an emission end behind the semiconductor laser 8. Connected to the monitor photodiode 9 are a resistor 11 for converting a current produced in accordance with the intensity of the emitted light into a voltage, an automatic optical power control circuit 6 for producing a signal for a feedback control of the intensity of the emitted light of the semiconductor laser 8 in accordance with the monitored result of the monitor photodiode 9 and supplying it to the semiconductor laser driver circuit 1, and a power supply 17. In addition, a thermistor 4 for measuring a temperature of the semiconductor laser 8, a thermoelectrical cooler 3 for cooling the semiconductor laser 8 and an automatic laser temperature control circuit 2 for controlling a temperature of the semiconductor laser 8 by using the thermistor 4 and the thermoelectrical cooler 3 are provided in the vicinity of the semiconductor laser.

Of the above elements, the semiconductor laser 8, the impedance matching element 12, the optical coupling lens system 15, an end of the optical fiber 16, the monitor photodiode 9, the thermistor 4 and the thermoelectrical cooler 3 are disposed in a semiconductor laser module 7. The semiconductor laser module 7 and other elements are disposed in an optical transmission module 18. The other end of the optical fiber 16 is pulled out from the optical transmission module 18 externally. Further, an input terminal 5 for inputting a signal to be supplied to the semiconductor laser driver circuit 1 is disposed in the optical transmission module 18.

In the embodiment, the semiconductor laser driver circuit 1 having an impedance of 25 Ω and the semiconductor laser 8 of InGaAsP system having an internal impedance $R_{LD}$ of 7 Ω in design are used. The impedance matching element 12 is formed of a printed resistor Ri having a resistance value of about 18 Ω in design in order to attain the impedance matching of the semiconductor laser driver circuit 1 and the semiconductor laser 8. The printed resistor Ri is formed by printing a film of tantalum nitride as a resistance body on a substrate of alumina. The reason why the printed resistor is used as the impedance matching element 12 is that a parasitic reactance is reduced when the optical transmission module of the embodiment is driven at a high frequency. Further, the impedance matching circuit 10 for preventing the reflection is formed of a microstrip line having a resistance value of 25 Ω.

In the embodiment, the fall time adjusting resistor 14 is formed of a carbon film surface mount resistor R1 having a resistor portion of which an external shape is 1.25 mm×2.00 mm. A parasitic inductance of the resistor R1 was about 1 nH. A resistance value of the resistor R1 is described later.

In the optical transmission module 18 of the embodiment, an input signal a from the input signal terminal 5 is supplied to the semiconductor laser driver circuit 1 to be converted into an optical modulation current. The optical modulation current is superposed on a DC bias current to be supplied to the semiconductor laser 8 through the impedance matching circuit 10 and the impedance matching element 12. Thus, the semiconductor laser 8 emits light and its forward emitted light is led to the optical fiber 16 through the optical coupling lens system 15. Backward emitted light is incident on the monitor photodiode 9. The monitor photodiode 9 draws a current in response to the incident light and the current is converted into a voltage by means of the resistor 11 to be applied to the automatic optical power control circuit 6. The automatic optical power control circuit 6 controls the semiconductor laser driver circuit 1 in accordance with the voltage from the resistor 11 and sets the magnitudes of the optical modulation current $i_m$ and the DC bias current $I_B$ so that the output current of the monitor photodiode 9 is made constant.

On the other hand, a temperature of the semiconductor laser 8 is detected by the thermistor 4 and the automatic temperature control circuit 2 controls the thermoelectrical cooler 3 in accordance with the detected output of the thermistor 4 to maintain the temperature of the semiconductor laser 8 constant.

Figure 5:
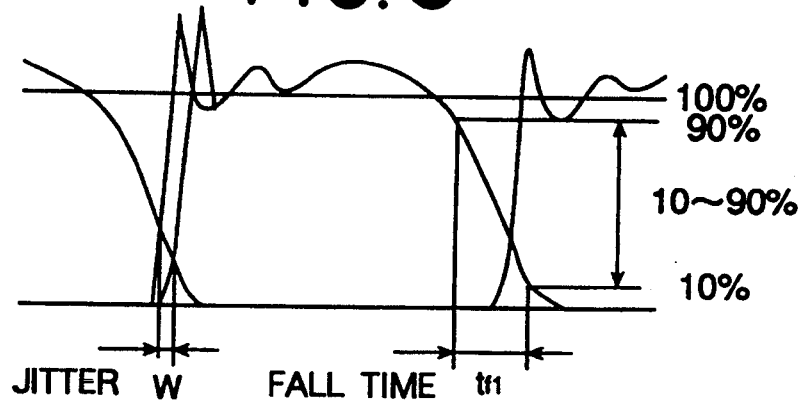
FIG. 5 shows an example of signal waveforms in the optical transmission module.

FIG. 5 shows waveforms of optical outputs of the semiconductor laser 8 in case where an NRZ (Non-Return-to-Zero) pseudo random bit sequence having a mark ratio of 50% is supplied to the driver circuit 1 as the input signal a. A fall time $t_{fl}$ of the optical waveform is expressed by the equation 1 indicated in FIG. 5. In the equation 1, CR represents a CR time constant of a parasitic capacitance and a resistance of the semiconductor laser, $f_r$ a relaxation oscillation frequency of the semiconductor laser 8, $t_{fic}$ a fall time of a signal supplied from the driver circuit 1 to the semiconductor laser 8, and $f_c$ a high-band cut-off frequency of an optical receiver (not shown) for detecting an optical waveform.

It is apparent from the equation 1 that the fall time $t_{fl}$ of the optical waveform greatly depends on properties of the semiconductor laser 8 and the driver circuit 1.

Figure 6:
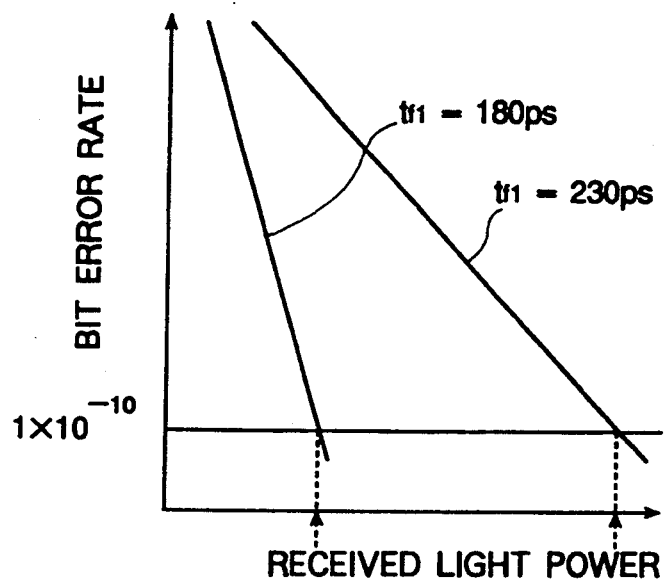
FIG. 6 is a graph showing a relation of a fall time of a signal and a bit error rate.

FIG. 6 shows a characteristic of a bit error rate for variation of the fall time $t_{fl}$ of the optical waveform. The receiving sensitivity is good when the fall time $t_{fl}$ of the optical waveform is short. In the characteristics curves, the optical reception power (on the side of reception) having a bit error rate of $1\times10^{-10}$ is herein defined as the receiving sensitivity and when the receiving sensitivity is small and good, a long-distance transmission is possible. In such a case, the rise time of the optical output waveform is sufficiently small and of high speed because of overshoot produced in the relaxation oscillation of the semiconductor laser 8. The receiving sensitivity characteristic is greatly controlled by the fall time $t_{fl}$ of the optical waveform and the bit error rate is deteriorated if the fall time $t_{fl}$ is long.

In the equation 1, R is equivalent to an input impedance $Z_{LDM}$ of the semiconductor laser module 7. Accordingly, by making small the input impedance $Z_{LDM}$ of the semiconductor laser module 7, the time constant CR of the equation 1 can be made small and the fall time of the optical waveform can be made small.

Figure 4:
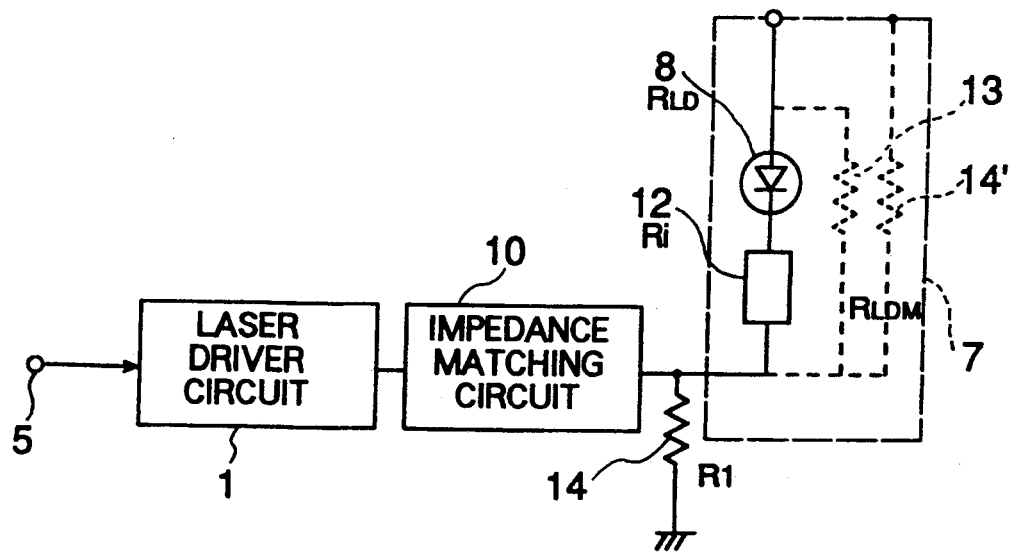
FIG. 4 is a block diagram schematically illustrating a part of the optical transmission module of the first embodiment of the present invention.

FIG. 4 schematically illustrates a partial circuit of from the input terminal 5 to the semiconductor laser 8 taken from the optical transmission module of the embodiment. The internal impedance $R_{LDM}$ of the semiconductor laser module 7 is equal to a sum of the impedance matching element 12 and an internal impedance $R_{LD}$ of the semiconductor laser 8. An apparent input impedance $Z_{LDM}$ of the semiconductor laser module 7 as viewed from the driver circuit is equal to $Z_{LDM}=R_{LDM}//R1$ of the internal impedance $R_{LDM}$ of the semiconductor laser module 7 and the resistor R1 constituting the fall time adjusting element 14 connected in parallel with each other as seen from FIG. 4. Accordingly, the provision of the resistor R1 of the fall time adjusting element 14 can reduce the input impedance $Z_{LDM}$ of the semiconductor laser module 7 and the fall time can be made small to thereby attain the high-speed operation.

Figure 3:
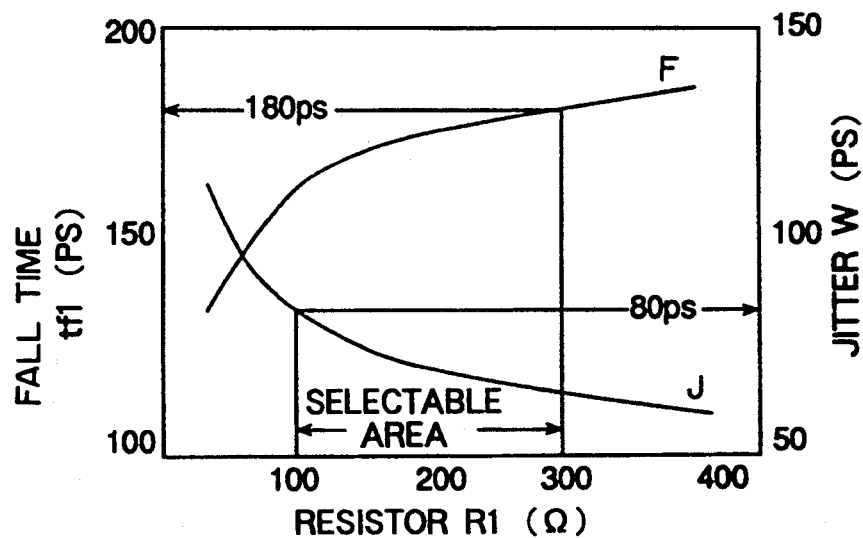
FIG. 3 is a graph showing variation of waveform in case where a resistance value of fall time control means is varied in the optical transmission module of the first embodiment of the present invention.

In the embodiment, a resistance value of the resistor R1 constituting the fall time adjusting resistor 14 is determined as follows. FIG. 3 is referred to showing a curve F of fall time changes and a curve J of jitter changes versus resistance changes of the resistor R1.

Since the optical transmission module of the embodiment can operate at a transmission speed of Gb/s, one time slot is 400 ps. An allowable practicable fall time having a sufficiently small bit error rate is 200 ps or less. In the embodiment, a resistance value of the resistance R1 constituting the fall time adjusting resistor 14 is determined to attain the fall time of 180 ps or less in anticipation of a measurement error of 20 ps with respect to 200 ps. Further, when the input impedance $Z_{LDM}$ of the semiconductor laser module is made too small in order to shorten the fall time, the impedance matching between the semiconductor laser module and the driver circuit 1 is not attained and a pattern effect jitter is increased at the rising edge of the signal. Thus, an allowable range of the jitter is defined as 80 ps or less and the resistance of resistor R1 is determined so as to satisfy this condition.

Accordingly, in the embodiment, a plurality of sorts of resistors having different resistance values of 20 Ω to 400 Ω were prepared as the resistor R1 and the circuit as shown in FIG. 4 was assembled actually. An NRZ (Non-Return-to-Zero) Pseudo Random Bit sequence having a mark ratio of 50% was supplied to the semiconductor laser driver circuit 1 as the input signal a. As a result, the optical output waveform of the semiconductor laser 1 was obtained as shown in FIG. 5. Thus, the jitter W was measured as an interval between points where rise portions of one pattern waveforms intersect fall portion of a just precedent pattern waveform and the fall time $t_{fl}$ was measured as a time of period of the output waveform falling from 90% to 10% in amplitude. The result thereof is shown in FIG. 3. As shown in FIG. 3, when the resistor R1 for the fall time adjusting resistor 14 is within the range of 100 Ω to 300 Ω, the fall time of 180 ps or less and the jitter of 80 ps or less could be attained.

A resistance value of $R1//R_{LDM}$ for the resistor R1 of 100 Ω to 300 Ω is 20 Ω to 23 Ω which is a slightly small value as compared with 25 Ω obtained when only the conventional impedance matching is considered.

In the embodiment both ends of the semiconductor laser 8 are connected through a ribbon lead (having a parasitic inductance of 0.8 nH) and four bonding wires (having a parasitic inductance of 0.4 nH). Further, a parasitic inductance of the printed resistor Ri for the impedance matching element 12 is about 0.2 nH. Accordingly, a parasitic inductance of the semiconductor laser module 7 is 2 (0.8+0.4)+0.2=2.6 nH. The embodiment uses the surface mount resistor R1 having a relatively high parasitic inductance of 1 nH as the fall time adjusting resistor 14 and accordingly the circuit of the embodiment in which the resistor R1 is connected in parallel can reduce the parasitic inductance to 0.7 nH.

The impedance mismatching occurring between the driver circuit 1 and the semiconductor laser due to a possible impedance error or deviation caused in at least any of the semiconductor laser 8 and the impedance matching element 12 is corrected by the fall time adjusting resistor 14. As described above, in the above embodiment, the value of impedance $R_{LD}$ of the semiconductor laser 8 and the resistance value of the printed resistor Ri constituting the impedance matching element 12 which were selected in the design are 7 Ω and 18 Ω, respectively. However, the semiconductor laser 8 has a non-uniform resistance value variable in the range of about ±40% in general. Further, the printed resistor has also a non-uniform resistance value variable in the range of about ±10%. Thus, in the case of the semiconductor laser 8 of the embodiment, the semiconductor laser of 4 to 10 Ω and the printed resistance of 16 to 20 Ω were provided.

Accordingly, when such semiconductor laser 8 and printed resistor Ri are used in the conventional transmitter arrangement, the necessary impedance matching is not obtained and the jitter of the optical transmission module is increased. Heretofore, the resistance values of the laser and the resistor must be checked and properly selected which satisfying their designed values. The optical transmission module of the embodiment can make correction of reducing the impedance of the semiconductor laser module by providing the fall time adjusting resistor 14. Thus, when the semiconductor laser 8 and the resistor Ri have been connected and if the sum of their resistance values is larger than 20 Ω, it can be corrected by the resistor R1 of the fall time adjusting resistor 14, and even the laser and the resistor Ri of such deviated resistances can be also used. Accordingly, the yield of the semiconductor laser 8 and the printed resistor Ri can be improved.

As described above, according to the embodiment, there can be provided the optical transmission module capable of operating at the transmission speed of 2.4 Gb/s and having the pattern effect jitter at the rising edge of 80 ps or less and the fall time of 180 ps or less. Further, the parasitic reactance of the semiconductor laser module 7 can be made smaller than that of the prior art. The yield of the semiconductor laser 8 and the impedance matching element 14 can be improved. The element 14 is connected outside of the semiconductor laser module 7 in the embodiment, while it may be incorporated into the module 7 as shown by broken line of FIG. 4 for the convenience of a manufacturer of the optical transmitter.

Embodiment 2

Figure 7:
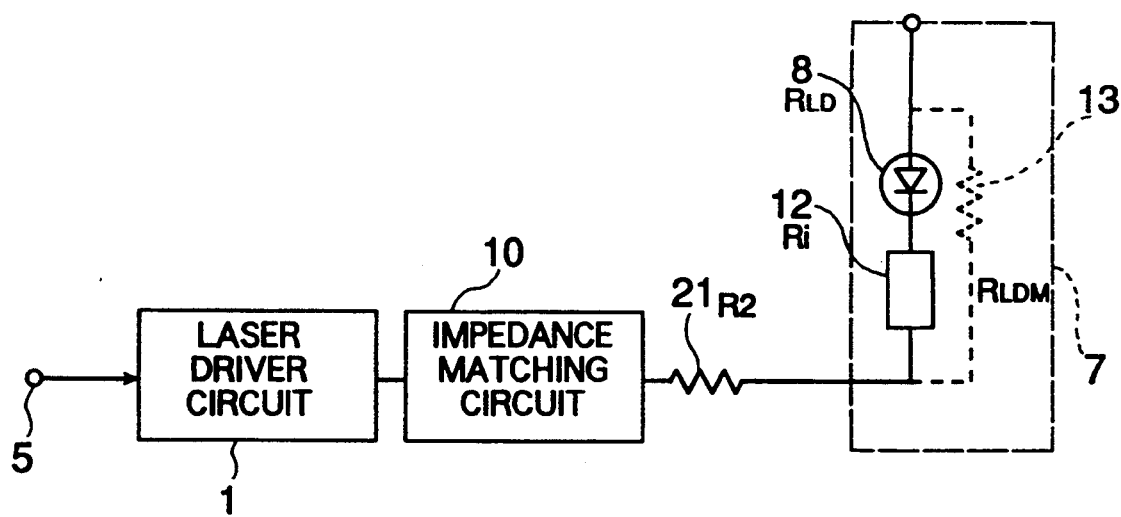
FIG. 7 is a block diagram schematically illustrating a part of an optical transmission module according to a second embodiment of the present invention.

An optical transmission module for use in 100 Mb/s according to a second embodiment of the present invention is now described. The optical transmission module of this embodiment includes, as shown in FIG. 7, a semiconductor laser 8 and a semiconductor laser driver circuit 1 connected to the semiconductor laser 8 for driving the semiconductor laser 8. An impedance matching element 12 is connected in series to the semiconductor laser 8 on the side of the driver circuit 1 thereof to effect the impedance matching of the semiconductor laser 8 and the driver circuit 1. Further, a second impedance matching element 12 is connected to correct a possible impedance mismatching of occurring between the semiconductor laser 8 and the driver circuit 1 due to a possible impedance an error caused in at least any of the semiconductor laser 8 and the impedance matching element 12. The semiconductor laser 8 is connected to the driver circuit 1 by means of an impedance matching circuit 10 for preventing the reflection.

Although not shown in FIG. 7, the optical coupling lens system 15, the optical fiber 16, the monitor photodiode 9, the resistor 11, the automatic optical power control circuit 6, the power supply 17, the thermistor 4, the thermoelectrical cooler 3 and the automatic temperature control circuit 2 may be provided. This circuit configuration is the same as the embodiment 1 and its description is omitted.

The embodiment uses the driver circuit 1 having an impedance of 25 $\Omega$ and the semiconductor laser 8 having an internal impedance $R_{LD}$ is designated as 7 $\Omega$ in design step. The impedance matching element 12 uses a printed resistor Ri whose resistance value is designated as 18 $\Omega$ in design in order for attaining the impedance matching of the driver circuit 1 and the semiconductor laser 8. The printed resistor Ri is formed by printing a film of tantalum nitride as a resistance body on a substrate of alumina. The reason why the printed resistor is used as the impedance matching element 12 is that its parasitic reactance is reduced when the optical transmission module of the embodiment is driven at a high frequency. Further, the antireflection impedance matching circuit 10 comprises a microstrip line having a resistance value of 25 $\Omega$. The second impedance matching element 21 comprises a carbon film surface mount resistor R2.

In this manner, in the embodiment, the internal impedance $R_{LD}$ of the semiconductor laser 8 and the resistance value of the printed resistor Ri constituting the impedance matching element 12 are designated as 7 $\Omega$ and 18 $\Omega$, respectively design step. However, the semiconductor laser 8 has a non-uniform resistance value variable in the range of about ±40% in general. Further, the printed resistor has also a non-uniform resistance value variable in the range of about ±10%. Thus, in the case of the semiconductor laser 8 of the embodiment, the semiconductor laser of 4 $\Omega$ to 10 $\Omega$ and the printed resistance of 16 $\Omega$ to 20 $\Omega$ were provided.

Accordingly, when such a semiconductor laser 8 and printed resistor Ri are used in the conventional transmitter arrangement, the impedance matching is not obtained and the jitter of the optical transmission module is increased. Heretofore, the laser and the resistor having resistance value satisfying the designed values are selected and used. The optical transmission module of the embodiment can make correction to increase an apparent input impedance of the semiconductor laser module by providing the second impedance matching element 21. Thus, when the semiconductor laser 8 and the resistor Ri have been connected and if the sum of their resistance values is smaller than 25 $\Omega$ it can be corrected by the resistor R2 of the second impedance matching element 21 to thereby be able to be used. Accordingly, the yield of the semiconductor laser 8 and the printed resistor Ri can be improved.

As a method for determining the necessary resistance value of the resistor R2 of the second impedance matching element 21, in this embodiment, a plurality of sorts of resistors were prepared as the resistor R2 and the circuit as shown in FIG. 7 was assembled and tested actually. An NRZ (Non-Return-to-Zero) Pseudo Random Bit Sequence having a mark ratio of 50% was supplied to the semiconductor laser driver circuit 1 as the input signal a. As a result, the optical output waveform of the semiconductor laser 8 was measured as shown in FIG. 5. Thus, in the Figure an interval between points where rise portions of one-pattern waveforms intersect fall portion of the just-precedent pattern was measured as the jitter W. The allowable range of jitter is defined to be 80 ps or less and when a measured jitter is within the allowable range, it is considered that the impedance matching is attained, and a resistance value of the resistor R2 is determined as necessary with such an allowable jitter.

This method can be used to define the resistance value of the resistor R2 of the second impedance matching element 21 without measuring possible variations is resistance values of the semiconductor laser 8 and the impedance matching element 12 one by one.

As described above, according to the embodiment, the yield of the semiconductor laser 8 and the printed resistor 12 can be improved while the rising pattern effect jitter is suppressed to a low level.

Embodiment 3

Figure 8:
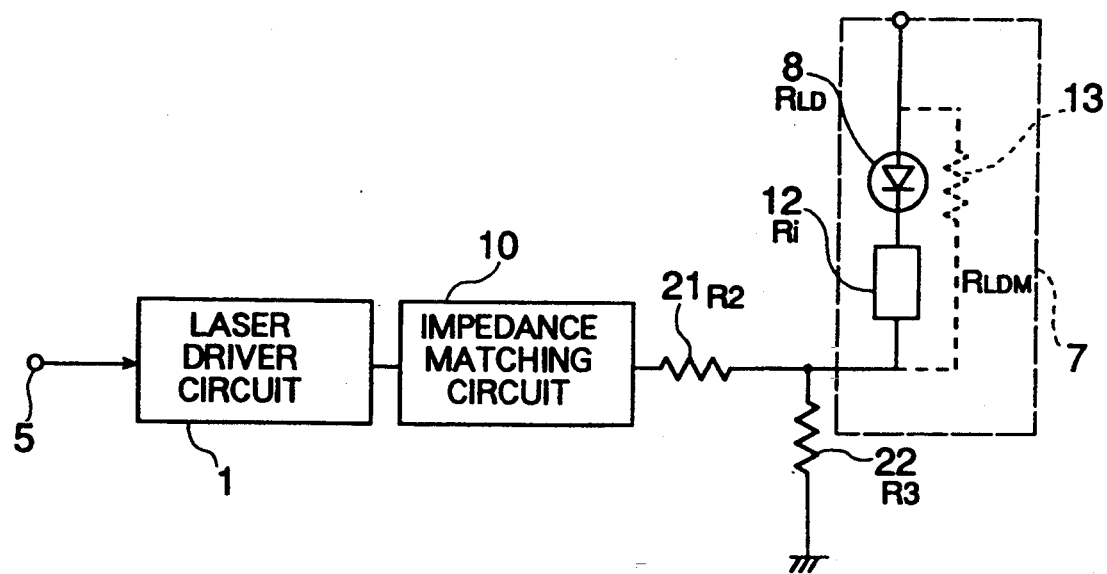
FIG. 8 is a block diagram schematically illustrating a part of an optical transmission module according to a third embodiment of the present invention.

An optical transmission module for use in 100 Mb/s according to a third embodiment of the present invention is now described. The optical transmission module of this embodiment includes, as shown in FIG. 8, a semiconductor laser 8, a semiconductor laser driver circuit 1, an impedance matching element 12 and an impedance matching circuit 10. Further, a second impedance matching element 12 is connected to correct possible mismatching of impedance occurring between the semiconductor laser 8 and the driver circuit 1 due to possible impedance errors or deviations of at least any of the semiconductor laser 8 and the impedance matching element 12. A third impedance matching element 22 is connected in parallel to the semiconductor laser 8 and the impedance matching element 12.

Although not shown in FIG. 8, an optical coupling lens system 15, optical fiber 16, monitor photodiode 9, resistor 11, automatic optical power control circuit 6, power supply 17, thermistor 4, thermoelectrical cooler and automatic temperature control circuit 2 may be provided. This circuit configuration is the same as the embodiment 1 and its description is omitted.

This embodiment uses the driver circuit 1 having an impedance of 25 $\Omega$ and the semiconductor laser 8 having an inner impedance $R_{LD}$ of 7 Ω respectively in design step. The impedance matching element 12 comprises a printed resistor Ri having a resistance value of 18 Ω in design for attaining the impedance matching of the driver circuit 1 and the semiconductor laser 8. The printed resistor Ri is formed by printing a film of tantalum nitride as a resistance body on a substrate of alumina. The reason why the printed resistor is used as the impedance matching element 12 is that a parasitic reactance is reduced when the optical transmission module of the antireflection embodiment is driven at a high frequency. Further, the antireflection impedance matching circuit 10 comprises a microstrip line having a resistance value of 25 Ω. The second impedance matching element 21 and the third impedance matching element 22 comprise carbon film surface mount resistors R2 and R3.

In this manner, in this embodiment, the internal impedance $R_{LD}$ of the semiconductor laser 8 and the resistance value of the printed resistor Ri constituting the impedance matching element 12 are given 7 Ω and 18 Ω, respectively in design step. However, the semiconductor laser 8 has a resistance value with possible variations in the range of about ±40% in general. Further, the printed resistor has also a resistance value with possible variations in the range of about ±10%. Thus, in the case of the semiconductor laser 8 of the embodiment, the semiconductor laser of 4 to 10 Ω and the printed resistances of 16 to 20 Ω were provided.

Accordingly, when the semiconductor laser 8 and the printed resistor Ri of such non-uniform resistances are used, the impedance matching is not always obtained and the jitter of the optical transmission module is increased. Heretofore, the laser and the resistor having resistance value satisfying the designed values were selected and used. The optical transmission module of this embodiment can make correction to increase or reduce an apparent input impedance of the semiconductor laser module 7 by providing the second impedance matching element 21 and the third impedance matching element 22. Thus, when the semiconductor laser 8 and the resistor Ri have been connected and if the sum of their resistance values is deviated from 25 Ω, it can be corrected by the resistor R2 of the second impedance matching element 21 and the third impedance matching element 22. Thus even the laser 8 and resistors of such non-uniform resistances can be used. Accordingly, the yield of the semiconductor laser 8 and the printed resistor Ri can be improved.

A method for determining the necessary resistance values of the resistor R2 of the second impedance matching element 21 and the resistor R3 of the third impedance matching element 22 is described. In the embodiment, a plurality of sorts of resistors were prepared as the resistor R3, and the circuit of FIG. 8 with the resistor R2 being removed was assembled actually. An NRZ (Non-Return-to-Zero) Pseudo Random Bit Sequence having a mark ratio of 50% was applied to the semiconductor laser driver circuit 1 as the input signal a. As a result, the optical output waveform of the semiconductor laser 8 was measured as shown in FIG. 5. Thus, an interval between points where the waveform at the rising edge is intersected with the falling waveform before one pattern was measured as the jitter W as shown in FIG. 5. The allowable range of jitter is defined to be 80 ps or less, and when a measured jitter is within the allowable range, it is considered that the impedance matching is attained, and a resistance value of the resistor R3 is determined as necessary with such an allowable jitter.

Further, a resistance value of $R3//R_{LDM}$ at this time is obtained by a measurement. Then, a calculation of 25 Ω-$(R3//R_{LDM})$ is made and the calculated value is determined as a resistance value of the second impedance matching element R2.

Commercially available resistors are used as surface mount resistors R2 and R3 and accordingly only the resistors of limited resistance values can be obtained. However, in the circuit configuration of the embodiment 3, since the parallel resistor R3 and the series resistor R2 can be combined, a resistance value that is not provided in the commercially available resistors can be provided. Thus, the impedance of the semiconductor laser module 7 can be coincident with the impedance of the driver circuit 1 with a high accuracy.

This method can be used to define and determine the resistance value of the resistor R2 of the second impedance matching element 21 and the resistance value of the third impedance matching element without measurement of non-uniform resistance values of the semiconductor laser 8 and the impedance matching element 12 one by one.

As described above, according to this embodiment, the yield of the semiconductor laser 8 and the printed resistor 12 can be improved while the rising pattern effect jitter is suppressed to a low level. In the embodiments 2 and 3, the jitter is measured to define the resistance value of the second impedance matching means 21, while it is also possible that the resistance values of the semiconductor laser 8 and the impedance matching element 12 are measured one by one and the resistance value of the second impedance matching element 21 is defined by calculation so that the semiconductor laser is matched to 25 Ω of the driver circuit 1.

In the embodiments 1, 2 and 3, a microstrip line is used as the impedance matching circuit, while other lines such as a coplanar waveguide with ground can be used. Further, carbon film surface mount resistors are used for the fall time adjusting resistor 14', the second impedance matching element 21 and the third impedance matching element 22, while other mount type resistors such as metal film surface mount resistors can be used.

In addition, in the embodiments 1, 2 and 3, an end of the semiconductor laser 8 is connected to ground, while it may be connected to a power supply. Since the power supply has a low voltage even if the end of the laser is connected to the power supply, it can be regarded that the semiconductor laser 8, the fall time adjusting element 14 and the third impedance element 22 are connected in parallel.

According to the present invention, by providing the means for reducing the fall time of the signal waveform, the optical transmitter capable of effecting communication at the transmission speed exceeding Gb/s with the low bit error rate can De obtained.

Further, according to another aspect of the present invention, by providing the second impedance adjusting means for correcting the impedance, the optical transmitter capable of being manufactured with a low cost while reducing the jitter can be obtained.

We claim:

1. A semiconductor module comprising a semiconductor laser connected to driving means to emit an optical signal, an impedance element connected between said semiconductor laser and said driving means for matching impedances between said semiconductor laser and said driving means, and a further impedance matching element connected between said semiconductor laser and said driving means for reducing an input impedance of said semiconductor laser module as viewed from said driving circuit in order to reduce a fall time of the optical signal.

2. A semiconductor module according to claim 1, wherein said semiconductor laser and said impedance element connected in series to each other and said further impedance matching element connected in parallel with said series connection are hermetically sealed.

3. An optical transmission module comprising:
a semiconductor laser module including a semiconductor laser and an impedance element;
a driving circuit for driving said semiconductor laser to emit an optical signal; and an optical fiber for transmitting the optical signal;
said impedance element, connected between said semiconductor laser and said driving circuit, being formed to match an impedance of said semiconductor laser module to an impedance of said driving circuit; and
an impedance matching element including a resistor, connected in parallel with said semiconductor laser module, for reducing an input impedance of said semiconductor laser module as viewed from said driving circuit to reduce a fall time of the optical signal.

4. An optical transmission module according to claim 3, wherein said resistor comprises a surface mount resistor.

5. An optical transmission module according to claim 4, wherein said resistor comprises a printed resistor including a substrate and a resistance body printed on said substrate.

6. An optical transmission module according to claim 3, wherein said driving circuit modulates said semiconductor laser with 2.4 Gb/s and said resistor is connected to reduce said fall time to 200 ps or less.

7. An optical transmission module comprising:
a semiconductor laser module hermetically sealed and including therein a semiconductor laser and an impedance element connected in series to each other;
driving means connected to said series connection for driving said laser to emit an optical signal;
optical fiber means for transmitting the optical signal; and
at least one of first impedance matching means and second impedance matching means, each matching means adjusts input impedance of said laser module as viewed from said driving means, wherein said first impedance matching means is connected in parallel with said series connection of said driving means and said semiconductor laser module and said second impedance matching means is connected between driving means and said semiconductor laser module and in series to said series connection of said semiconductor laser and said impedance element.

8. An optical transmission module comprising:
a semiconductor laser;
a driving circuit for driving said semiconductor laser to emit an optical signal;
an optical fiber for transmitting emitted light of said semiconductor laser;
first impedance matching means for matching impedances between said semiconductor laser and said driving circuit; and
second impedance matching means for correcting impedance mismatching occurring between said semiconductor laser and said driving circuit due to an error of an impedance included in at least any of said semiconductor laser and said first impedance matching means;
wherein said first impedance matching means includes a resistor connected in series to said semiconductor laser between said semiconductor laser and said driving circuit, and said second impedance matching means includes at least any of a second resistor connected in parallel with said semiconductor laser and a third resistor connected in series to said series connection of said first resistor and said semiconductor laser between said driving circuit and said semiconductor laser.

9. An optical transmission module according to claim 8, wherein said resistor R1 disposed in parallel with said semiconductor laser has the function of an impedance element for reducing an input impedance of said semiconductor laser module as viewed from said driving circuit in order to reduce a fall time of the signal.

10. An optical transmission module according to claim 9, wherein said driving circuit modulates said semiconductor laser with 2.4 Gb/s and said second impedance matching element reduces fall time to 200 ps or less.

11. An optical transmission module according to claim 9, wherein said resistor comprises a surface mount resistor.

12. An optical transmission module according to claim 11, wherein said resistor comprises a printed resistor including a substrate and a resistance body printed on said substrate.

13. An optical transmission module according to claim 8, wherein said resistor comprises a printed resistor including a substrate and a resistance body printed on said substrate.

* * * * *